United States Patent
Dadashev

(10) Patent No.: US 6,448,822 B1
(45) Date of Patent: Sep. 10, 2002

(54) COMPARATOR FOR NEGATIVE AND NEAR-GROUND SIGNALS

(75) Inventor: Oleg Dadashev, Hadera (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 09/956,438

(22) Filed: Sep. 18, 2001

(51) Int. Cl.[7] ................................................. H03K 5/22
(52) U.S. Cl. ......................................... 327/65; 330/261
(58) Field of Search .............................. 327/63–67, 89; 330/252, 253, 261

(56) References Cited

U.S. PATENT DOCUMENTS 5,554,943 A * 9/1996 Moreland ................... 327/563

OTHER PUBLICATIONS

Yin et al.; "A High–Speed CMOS Comparator With 8–b Resolution"; IEEE Journal of Solid State Circuits, vol. 27, No. 2, Feb. 1992; pp. 208–211.

Hammerschmied et al.; "Design and Implementation of an Untrimmed MOSFET–Only 10–Bit A/D Converter with—79–db THD"; IEEE Journal of Solid State Circuits, vol. 33, No. 8, Aug. 1998; pp. 1148–1157.

* cited by examiner

*Primary Examiner*—Kenneth B. Wells

(57) ABSTRACT

A comparator circuit that transforms a difference between two input voltage signals into differential branch currents that are independent of the two input voltage signals. In one embodiment, the comparator circuit utilizes an adaptive bias voltage circuit and a cascode stage to generate the differential branch currents that are applied to a conventional CMOS latch. The adaptive bias voltage circuit utilizes a current source and the two input voltages to generate a bias voltage that is directly proportional to an average of the two input voltage signals. The cascode stage includes two parallel branches, each including an n-channel transistor connected in series with a p-channel transistor between the CMOS latch and ground. The bias signal is applied to the gate terminals of the n-channel transistors of both branches, and the two input voltages are respectively applied to the gate terminals of the p-channel transistors of the branches.

20 Claims, 4 Drawing Sheets

COMPARATOR FOR NEGATIVE AND NEAR-GROUND SIGNALS

FIELD OF THE INVENTION

The present invention relates to comparator circuits, and in particular to high speed comparator circuits having a wide dynamic range.

RELATED ART

A comparator is a circuit that compares two input signals, and generates an output signal that indicates which of the two input signals is larger. Comparator circuits are used, for example, to convert analog input signals into digital values. High speed, accuracy and a wide dynamic range are important characteristics of comparators. However, it is difficult to achieve all three characteristics at the same time.

FIG. 1 is a block diagram showing a prior art comparator circuit 100 that compares two analog input voltages $V_{IN1}$, and $V_{IN2}$, and generates full swing output signals $V_{OUT1}$ and $V_{OUT2}$ that indicate the larger of input voltages $V_{IN1}$, and $V_{IN2}$. Comparator circuit 100 includes a current source 110, a differential input circuit 120, and a CMOS latch 130. Current source 110 is controlled by a current source bias signal $V_{CSB}$ to draw a bias current $I_{A+B}$ from differential input circuit 120. Differential input circuit 120 generates currents $I_A$ and $I_B$ that are proportional to input voltages $V_{IN1}$, and $V_{IN2}$, and whose sum is equal to bias current $I_{A+B}$ CMOS latch 140 is controlled by clock signals φ1 and φ2 to sequentially operate in reset, comparison, and latch operating modes. The reset mode is used to initialize CMOS latch 130. During the comparison and latch modes, currents $I_A$ and $I_B$ are used to set output signals $V_{OUT1}$ and $V_{OUT2}$ in a first state ($V_{OUT1}$ is high and $V_{OUT2}$ is low), or a second state $V_{OUT1}$ is low and $V_{OUT2}$ is high), thereby indicating which of input signals $V_{IN1}$, and $V_{IN2}$ is larger. Additional details regarding the operation of comparator circuit 100 are provided below.

FIG. 2 is a simplified schematic diagram showing a CMOS implementation of comparator circuit 100.

As indicated in FIG. 2, current source 110 includes an n-channel transistor M1 connected between input circuit 120 and ground. A gate terminal of n-channel transistor M1 is connected to receive an externally generated bias signal VCSB, which is used to set bias current $I_{A+B}$.

Input circuit 120 includes a differential input transistor pair M2 and M3 that are connected in parallel between CMOS latch 130 and current source 110. Current $I_A$ is generated in a first conductor 122 that is connected between transistor M2 and a node NA of CMOS latch 130. Current $I_B$ is generated on a second conductor 124 that is connected between transistor M3 and a node NB of CMOS latch 130. The gate terminals of transistors M2 and M3 are respectively connected to input voltages $V_{IN1}$, and $V_{IN2}$.

CMOS latch 130 includes a p-channel flip-flop 132 connected between a system voltage source and nodes NA and NB, an n-channel flip-flop 134 connected between ground and a second pair of nodes NC and ND, a pair of p-channel pass transistors M6 and M7 connected between flip-flops 132 and 134, a p-channel switch M8 connected between nodes NA and ND, and a pair of n-channel precharge transistors M11 and M12 respectively connected to nodes NC and ND. P-channel flip-flop 132 includes p-channel transistors M4 and M5 that are respectively connected between the system voltage source and nodes NA and NB, with the gate terminal of transistor M4 connected to node NB and the gate terminal of transistor M5 connected to node NA. P-channel pass transistors M6 and M7 are controlled by second clock signal φ2. P-channel pass transistor M6 is connected between node NA and node NC (which is connected to output terminal $V_{OUT1}$), and p-channel pass transistor M7 is connected between node NB and node ND (which is connected to output terminal $V_{OUT2}$). P-channel switch M8 has a gate terminal connected to receive first clock signal φ1. N-channel flip-flop 134 includes n-channel transistors M9 and M10. Transistor M9 is connected between node NC and ground and has a gate terminal connected to node ND, and transistor M10 is connected between node ND and ground and has a gate terminal connected to node NC. Precharge transistors M11 and M12 have gate terminals connected to receive second clock signal φ2, with precharge transistor M11 connected between node NC and ground, and precharge transistor M12 connected between node ND and ground.

FIGS. 3(A) and 3(B) are timing diagrams showing the voltage levels of clock signals φ1 and φ2 during the reset mode (i.e., time interval T1–T2), comparison mode (i.e., time interval T2–T3), and latch mode (i.e., time interval T3–T4) of CMOS latch 130. During the reset mode (time interval T1–T2), first clock signal φ1 is low and second clock signal φ2 is high. During the comparison mode (time interval T2–T3), both clock signals φ1 and φ2 are high. During the latch mode (time interval T3–T4), first clock signal φ1 is high and second clock signal φ2 is low.

Operation of comparator circuit 100 will now be described with reference to FIGS. 2, 3(A), and 3(B).

During the reset mode, the low clock signal φ1 turns on switch M8, thereby equalizing nodes NA and NB and resetting p-channel flip-flop 132. In addition, the high clock signal φ2 turns off p-channel pass transistors M6 and M7, and turns on n-channel precharge transistors M11 and M12, thereby pulling down nodes NC and ND and resetting n-channel flip-flop 134 to ground (i.e., both output signals $V_{OUT1}$ and $V_{OUT2}$ are low). Because p-channel pass transistors M6 and M7 are turned off, node NA is isolated from node NC, and node NB is isolated from node ND. Under these conditions, the sum of the currents flowing through transistors M4 and M5 (i.e., currents $I_A$ and $I_B$) is equal to $I_{A+B}$ and is independent of input signals $V_{IN1}$, and $V_{IN2}$ (assuming input signals $V_{IN1}$, and/or $V_{IN2}$ is/are within the dynamic range). Similarly, during the reset mode, the voltage at nodes NA and NB is equal to a reset voltage that is independent of input signals $V_{IN1}$, and $V_{IN2}$.

At the beginning of the comparison mode (time T2 in FIGS. 3(A) and 3(B)), both clock signals φ1 and φ2 are high. Accordingly, first clock signal φ1 turns off (opens) switch M8, thereby disconnecting nodes NA and NB and initiating the operation of p-channel flip-flop 132. Immediately after time T2, if input signal $V_{IN1}$, is less than input signal $V_{IN2}$, then the current through p-channel transistor M5 is greater than the current through p-channel transistor M4, thereby causing the voltage at node NA to increase from the reset voltage and the voltage at node NB to decrease from the reset voltage. Conversely, when input signal $V_{IN1}$ is greater than input signal $V_{IN2}$, then the current through p-channel transistor M5 is less than the current through p-channel transistor M4, and the voltage at node NA decreases from the reset voltage while the voltage at node NB increases from the reset voltage.

At the beginning of the latch mode (time T3), clock signal φ2 switches low, thereby turning off precharge transistors M11 and M12, and turning on (closing) pass transistors M6 and M7. The voltage gain between nodes NA and NB, which is caused by the difference between the currents through p-channel transistors M4 and M5 of p-channel flip-flop 132 during the comparison mode, is transferred through pass transistors M6 and M7, respectively, to n-channel flip-flop 134. If input signal $V_{IN1}$, is less than input signal $V_{IN2}$, then the signal passed through n-channel pass transistor M6 to node NC is greater than the signal passed through n-channel pass transistor M7 to node ND, thereby latching flip-flop 134 in a first state (i.e., output signal $V_{OUT1}$ is high, and output signal $V_{OUT2}$ is low). Conversely, if input signal $V_{IN1}$ is greater than input signal $V_{IN2}$, then the signal passed through n-channel pass transistor M6 to node NC is less than the signal passed through n-channel pass transistor M7 to node ND, thereby latching flip-flop 134 in a second state (i.e., output signal $V_{OUT1}$ is low, and output signal $V_{OUT2}$ is high).

A problem associated with prior art comparator circuit 100 is that at least one of the two input signals (i.e., either $V_{IN1}$ or $V_{IN2}$) must be significantly greater than ground in order for differential input circuit 120 to reliably toggle CMOS latch 130, thereby limiting the dynamic range of comparator circuit 100. Specifically, if both input voltages $V_{IN1}$, and $V_{IN2}$ are negative or near-ground, then neither transistor of differential input transistor pair M2 and M3 is turned on (i.e., identical currents $I_A$ and $I_B$ are applied to CMOS latch 130 during the comparison mode). Consequently, output signals VOWT and $V_{OUT2}$ fail to indicate which of the negative or near-ground input signals $V_{IN1}$ and $V_{IN2}$ is greater (i.e., more positive).

What is needed is a comparator circuit that can compare two negative or near-ground input signals.

SUMMARY

The present invention is directed to a comparator circuit that transforms a difference between two input voltage signals into differential branch currents that are determined by a difference between the two input voltage signals, but are independent of an average of the two input voltage signals. The differential branch currents are then applied, for example, to a CMOS latch that operates in a conventional manner to generate output signals indicating which of the two input voltage signals is greater. Because the differential branch currents are independent of the average input voltage, the comparator circuit of the present invention is able to compare two negative or nearground input voltage signals, thereby overcoming the limitations of prior art comparator circuits.

In accordance with an embodiment of the present invention, a comparator circuit includes an adaptive bias voltage circuit, a cascode stage, and a conventional CMOS latch.

The adaptive bias voltage circuit generates a bias voltage that is directly proportional to an average of the two input voltage signals. The adaptive bias voltage circuit includes a current source, a n-channel transistor having drain and gate terminals connected to the current source, and a pair of p-channel transistors that are connected between a source terminal of the n-channel transistor and ground. The two input voltage signals are respectively applied to the gate terminals of the p-channel transistors. The bias voltage is generated at the gate/drain terminals of the n-channel transistor. In operation, when the average of the two input voltage signals is negative or near-ground, conductance through the p-channel transistors is relatively high, thereby pulling the bias voltage to a relatively low level. Conversely, when the average of the two input voltage signals is positive (i.e., above ground), conductance through the p-channel transistors is relatively low, thereby causing the bias voltage to be relatively high.

The cascode stage utilizes the bias voltage generated by the adaptive bias voltage circuit to generate branch currents that are determined solely by a difference between the two input voltage signals (i.e., the branch currents are independent of the average input voltage). The cascode stage includes a first branch that includes a first p-channel transistor and a first n-channel transistor connected in series between the CMOS latch and ground, and a second branch that includes a second p-channel transistor and a second n-channel transistor connected in series between the CMOS latch and ground. The bias voltage is applied to the gate terminals of the first and second n-channel transistors, and the two input voltages are applied to the gate terminals of the first and second p-channel transistors. When the bias voltage is relatively low (indicating that the average input voltage is negative or near-ground), the resistance of the n-channel transistors is relatively high, thereby restricting the current flow through the p-channel transistors (which would otherwise be relatively high due to the negative or near-ground average input voltage). Conversely, when the bias voltage is relatively high (indicating that the average input voltage is positive), the resistance of the n-channel transistors is relatively low, thereby increasing the current flow through the p-channel transistors (which would otherwise be relatively low due to the positive average input voltage). In this manner, the differential branch currents through the first and second branches of the cascode stage are independent of the input voltages signals, thereby providing a greater dynamic range than that provided by prior art comparator circuits.

The novel aspects of the present invention will be more fully understood in view of the following description and drawings.

DETAILED DESCRIPTION

Figure 4:
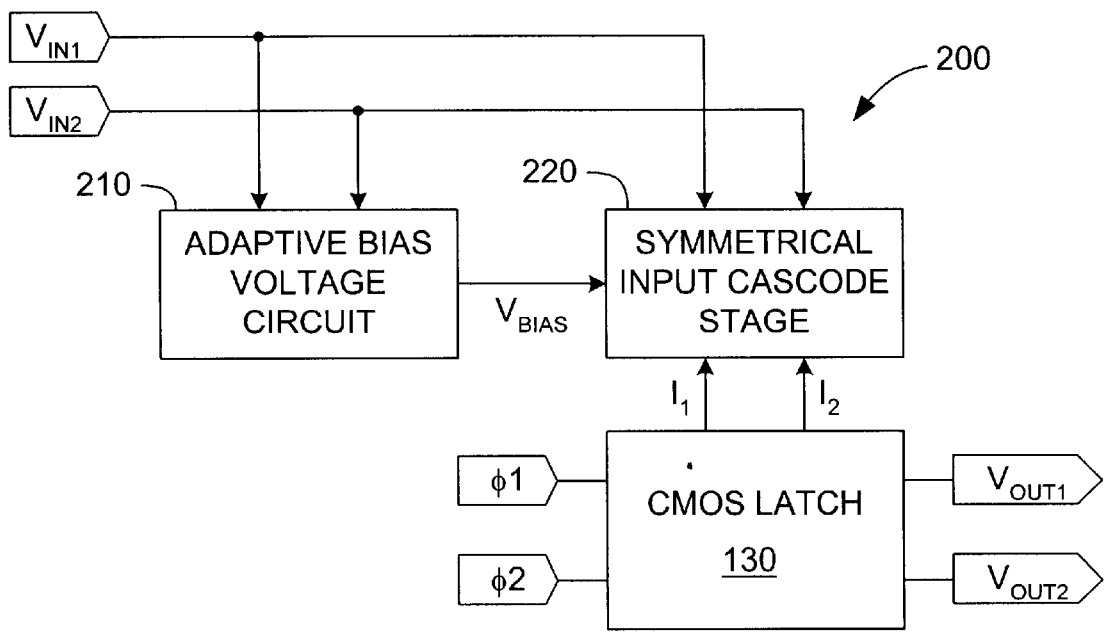
FIG. 4 is a block diagram of a comparator circuit according to the present invention.

FIG. 4 is a block diagram showing a simplified block diagram of a comparator circuit 200 according to the present invention. Comparator circuit 200 includes an adaptive bias voltage circuit 210, a symmetrical input cascode stage 220, and CMOS latch 130 (which is also utilized in prior art comparator circuit 100, described above).

In accordance with a first aspect of the present invention, adaptive bias voltage circuit 210 receives input voltage signals $V_{IN1}$, and $V_{IN2}$, and generates a bias (voltage) signal $V_{BIAS}$ that varies with an average input voltage Vo of input voltage signals $V_{IN1}$, and $V_{IN2}$ (i.e., Vo=$(V_{IN1}+V_{IN2})/2$). In particular, when the average input voltage Vo increases by a certain amount (i.e., input voltage signals $V_{IN1}$, and/or $V_{IN2}$ increase from first to second values), then bias signal $V_{BIAS}$ increases by the same amount such that a difference between bias signal $V_{BIAS}$ and the average input voltage Vo remains constant.

Referring again to FIG. 4, bias signal $V_{BIAS}$ is transmitted to cascode stage 220, which also receives input voltage signals $V_{IN1}$, and $V_{IN2}$, and which draws differential branch currents $I_1$ and $I_2$ from CMOS latch 130. CMOS latch 130 also receives clock signals φ1 and φ2, and generates output signals $V_{OUT1}$ and $V_{OUT2}$ whose values are determined by branch currents $I_1$ and $I_2$ in accordance with the reset, comparison, and latch operating modes described above with reference to prior art comparator circuit 100.

A key difference between comparator circuit 200 and prior art comparator circuit 100 is the manner in which branch currents $I_1$ and $I_2$ are generated by cascode stage 220.

As discussed above, prior art comparator circuit 100 utilizes a differential input circuit including n-channel input transistors M2 and M3 whose gate terminals are respectively connected to receive input voltage signals $V_{IN1}$, and $V_{IN2}$. This structure limits the dynamic range of prior art comparator circuit 100 by requiring at least one of input voltage signals $V_{IN1}$, and $V_{IN2}$ to be above ground. That is, if both input voltage signals $V_{IN1}$, and $V_{IN2}$ are negative or near-ground, then neither of n-channel input transistors M2 and M3 are turned on, thereby preventing current flow along branches 122 and 124.

In accordance with a second aspect of the present invention, and in contrast to prior art comparator circuit 100, cascode stage 220 utilizes bias signal $V_{BIAS}$ to generate branch currents $I_1$ and $I_2$ that are both independent of average input voltage Vo, and are proportional to a differential voltage ΔV, which is equal to a difference between input voltage signals $V_{IN1}$ and $V_{IN2}$, even if both input voltage signals $V_{IN1}$, and $V_{IN2}$ are negative or near-ground. In particular, cascode stage 220 utilizes bias signal $V_{BIAS}$ in cooperation with input voltage signals $V_{IN1}$ and $V_{IN2}$ to generate branch currents $I_1$ and $I_2$ whose sum/difference remains essentially constant over a practical operating range of comparator circuit 200. Because branch currents $I_1$ and $I_2$ are independent of average input voltage Vo, comparator circuit 200 is capable of comparing two negative or near-ground voltage signals, thereby overcoming the limitations of prior art comparator circuit 100 (discussed above).

Figure 5:
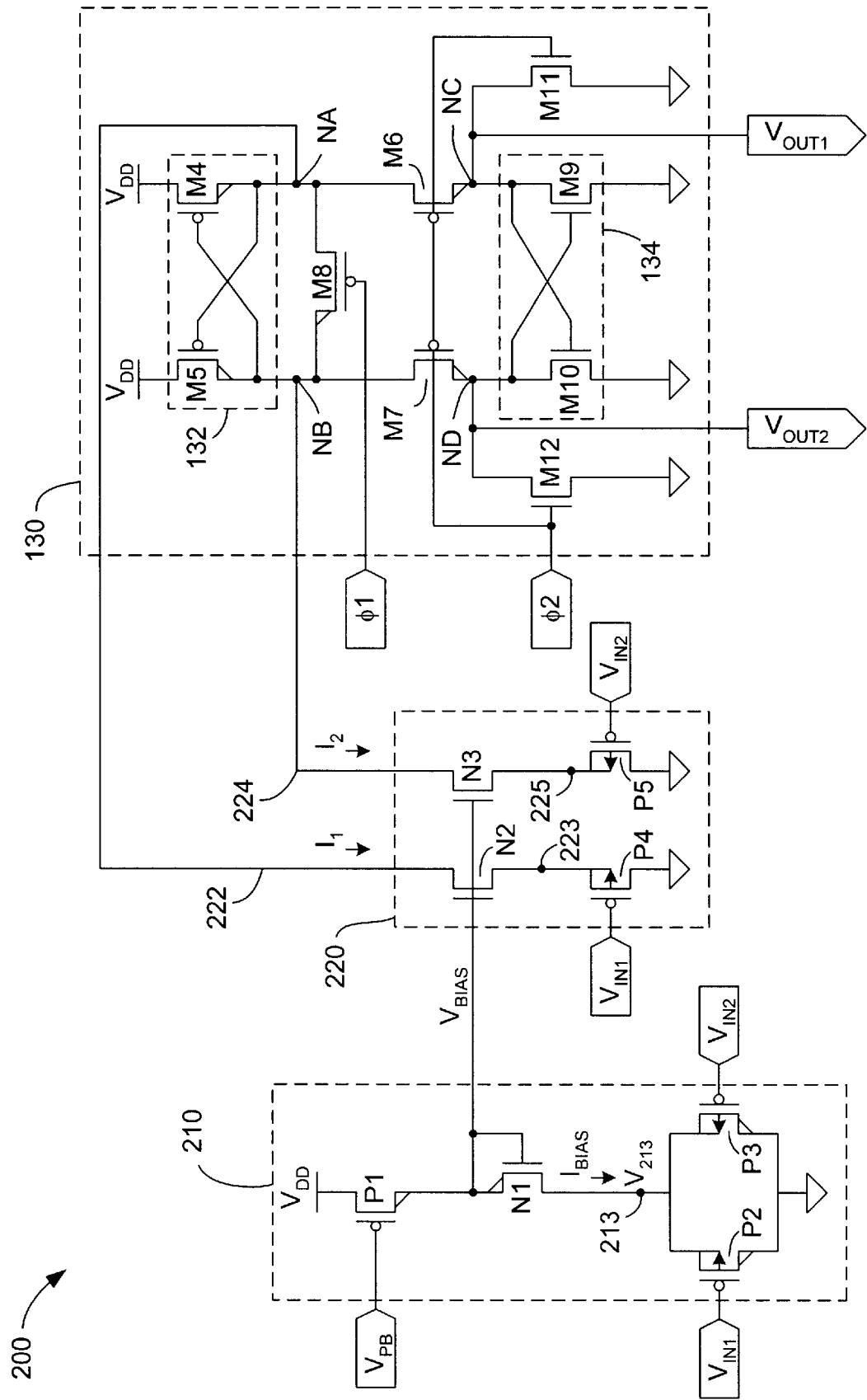
FIG. 5 is a schematic diagram of the comparator circuit shown in FIG. 4 in accordance with a specific embodiment of the present invention.

FIG. 5 is a schematic diagram showing details of comparator circuit 200 in accordance with a specific embodiment of the present invention.

Referring to the left side of FIG. 5, adaptive bias voltage circuit 210 includes a p-channel transistor P1, a n-channel transistor N1, and input p-channel transistors φ2 and P3. P-channel transistor P1 has a source terminal connected to a system voltage source $V_{DD}$, a gate terminal connected to receive an externally-generated control voltage $V_{PB}$, and a drain terminal connected to the drain and gate terminals of n-channel transistor N1, which also serves as an output node from which bias signal $V_{BIAS}$ is generated. The source terminal of N-channel transistor N1 is connected to the drain terminals of input p-channel transistors P2 and P3, whose gate terminals are respectively connected to receive input voltage signals $V_{IN1}$, and $V_{IN2}$, and whose drain terminals are connected to ground.

Adaptive bias voltage circuit 210 generates bias signal $V_{BIAS}$ by applying bias current $I_{BIAS}$ generated by current source P1 to parallel p-channel transistors φ2 and P3. The total current through parallel p-channel transistors φ2 and P3 is determined by the average input voltage Vo of input voltage signals $V_{IN1}$, and $V_{IN2}$, which are respectively applied to the gate terminals of p-channel transistors φ2 and P3. When the average input voltage Vo of input voltage signals $V_{IN1}$, and $V_{IN2}$ is negative or near-ground, bias signal $V_{BIAS}$ is relatively low. Conversely, when the average input voltage Vo is positive (i.e., above ground), the bias signal $V_{BIAS}$ is relatively high. In either case, bias signal VBIAS is positive (above ground).

Referring to the central region of FIG. 5, cascode stage 220 includes a first branch 222 and a second branch 224. First branch 222 extends between node NA of CMOS latch 130 and ground, and includes a first p-channel transistor P4 and a first n-channel transistor N2 connected in series. Similarly, second branch 224 extends between node NB of CMOS latch 130 and ground, and includes a second p-channel transistor P5 and a second n-channel transistor N3 connected in series. Bias signal $V_{BIAS}$ is applied to the gate terminals of n-channel transistors N2 and N3, and input voltage signals $V_{IN1}$, and $V_{IN2}$ are applied to the gate terminals of p-channel transistors P4 and P5, respectively.

During operation cascode stage 220 cooperatively utilizes bias signal $V_{BIAS}$ and input voltage signals $V_{IN1}$, and $V_{IN2}$ to produce branch currents $I_1$ and $I_2$ that are based on differential input voltage □V (i.e., the difference between $V_{IN1}$, and $V_{IN2}$), and are independent of the average input voltage Vo. Referring to FIG. 5, bias signal $V_{BIAS}$ turns on n-channel transistors N2 and N3 in an amount that is directly proportional to the average input voltage Vo. At the same time, input voltage signals $V_{IN1}$, and $V_{IN2}$ turn off p-channel transistors P4 and P5, respectively, in an amount that is directly proportional to input voltage signals $V_{IN1}$ and $V_{IN2}$, respectively. By controlling bias signal $V_{BIAS}$ such that a difference between bias signal $V_{BIAS}$ and the average input voltage Vo remains constant, bias signal $V_{BIAS}$ and input voltage signals $V_{IN1}$, and $V_{IN2}$ cooperate to produce branch currents $I_1$ and $I_2$ that are based only on differential input voltage □V. For example, when the average input voltage Vo increases and the differential input voltage ΔV is constant (i.e., $V_{IN1}$, and $V_{IN2}$ increase together), then $V_{BIAS}$ increases by the same amount that Vo increases (as $V_{IN1}$, and $V_{IN2}$ increase) because $V_{BIAS}=V_{IN1}+V_{gs}^{P2}+V_{gs}^{N1}=V_{IN2}+V_{gs}^{P3}+V_{gs}^{N1}$, and because $V_{gs}^{P2}$, $V_{gs}^{P3}$, $V_{gs}^{N1}$ are dependent only on $I_{BIAS}$ Accordingly, $V_{BIAS}-V_{IN1}=V_{gs}^{P4}+V_{gs}^{N2}$ and $V_{BIAS}-V_{IN2}=V_{gs}^{P5}+V_{gs}^{N3}$ in this case do not change. Further, essentially identical currents flow through transistors P2 and N2, and through transistors P3 and N3, the $V_{gs}$ voltages of these transistors (i.e., $V_{gs}^{P2}$, $V_{gs}^{N2}$, $V_{gs}^{P3}$, and $V_{gs}^{N3}$) can only change by equal amounts. Therefore, if $V_{gs}^{P4}+V_{gs}^{N2}$ is constant, then $V_{gs}^{P4}$ is constant and $V_{gs}^{N2}$ is constant for all increases in average voltage Vo, so $I_1$ and $I_2$ do not change. Conversely, when average input voltage Vo decreases and the differential input voltage ΔV remains constant, $V_{BIAS}$ decrease by the same amount as Vo, but $I_1$ and $I_2$ do not change. By controlling bias signal $V_{BIAS}$ in this manner, the sum of the branch currents $I_1$ and $I_2$ remain constant for all input voltage signals $V_{IN1}$ and $V_{IN2}$, and the total current $I_1+I_2$ is effected only by changes in bias current $I_{BIAS}$, not changes in average input voltage Vo or differential input voltage ΔV. Therefore, the cascode stage 220 is able to compare both negative and/or near-ground input signals, as well as two positive signals, thereby overcoming the limitations of prior art comparator circuit 100. In addition, comparator circuit 200 exhibits the high speed and accuracy of prior art comparator circuit 100 because of CMOS latch 130, which is identical to that utilized in prior art comparator switch 100, discussed above.

Technical aspects of cascode stage 220 will now be described.

Figure 1:
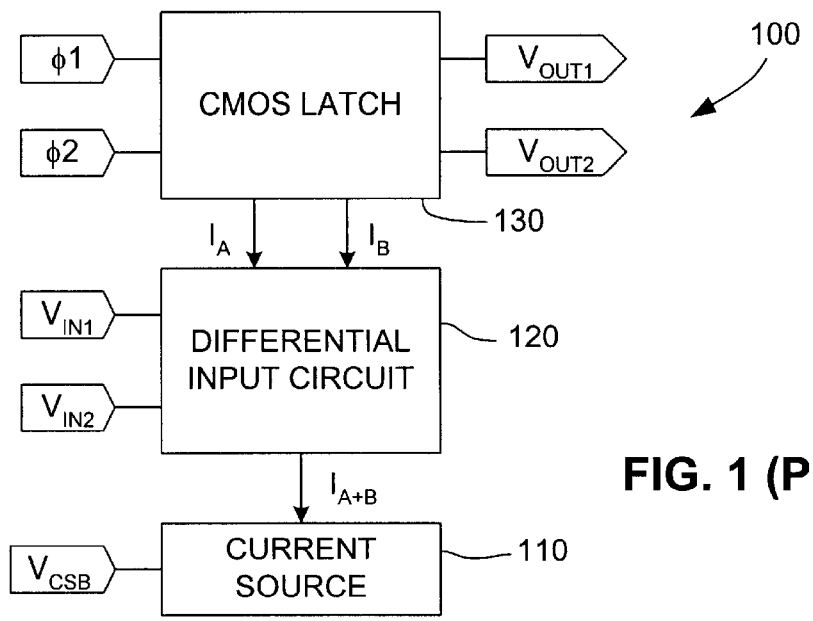
FIG. 1 is a block diagram showing the basic components of a prior art comparator circuit.
Figure 2:
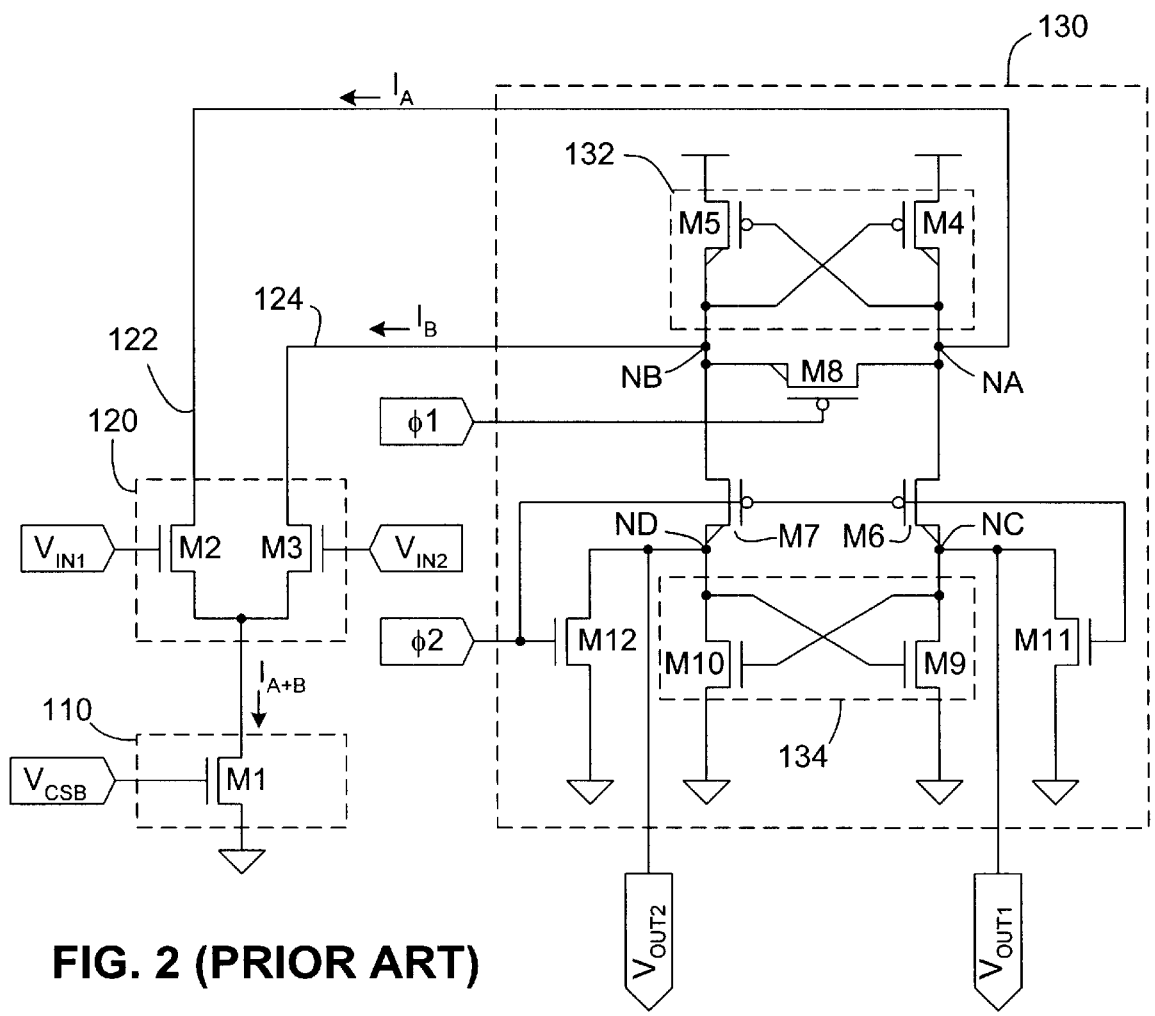
FIG. 2 is a schematic diagram showing the prior art comparator circuit in additional detail.
Figure 3A:
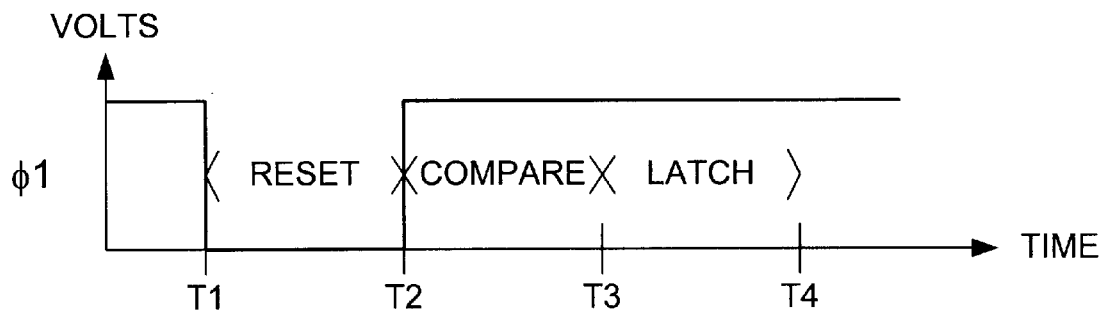
FIGS. 3(A) and 3(B) are timing diagrams showing the states of clock signals supplied to the prior art comparator circuit during various operational modes.
Figure 3B:
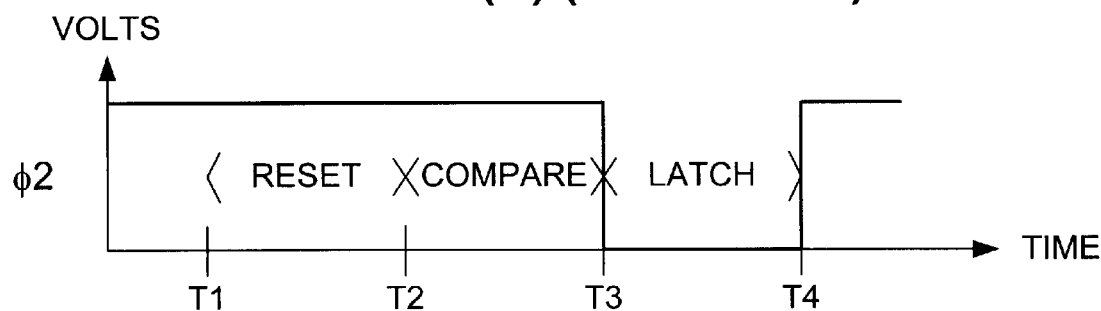

During the reset operating mode (i.e., between times T1 and T2: see FIGS. 3(A) and 3(B)), assuming all of the transistors of cascode state 220 (i.e., p-channel transistors P4 and P5, and n-channel transistors N2 and N3) and the transistors M4 and M5 of CMOS latch 130 are in the strong inversion region, then the following equations can be written for the branch currents $I_1$ and $I_2$:

$$I_1 = K1 \cdot (V_1 - V_{IN1} - V_{T1})^2 \quad (1.a)$$

$$I_1 = K2 \cdot (V_{BIAS} - V_1 - V_{T2})^2 \quad (1.b)$$

$$I_2 = K1 \cdot (V_2 - V_{IN2} - V_{T1})^2 \quad (1.c)$$

$$I_2 = K2 \cdot (V_{BIAS} - V_2 - V_{T2})^2 \quad (1.d)$$

where:
K1 and K2 are transconductance parameters of transistor pair P4 and P5, and transistor pair N2 and N3, respectively;

$V_{T1}$ and $V_{T2}$ are threshold voltages of transistor pair P4 and P5 and transistor pair N2 and N3, respectively;

$V_1$ and $V_2$ are voltages at nodes 223 and 225, respectively; and $I_1$ and $I_2$ are currents of branches 222 and 224, respectively.

From equations (1.a) through (1.d), branch currents $I_1$, and $I_2$ can be rewritten as function of the input voltage signals $V_{IN1}$ and $V_{IN2}$ as follows:

$$I_1 = A \cdot (V_{BIAS} - V_{IN1} - V_{T12})^2 \quad (2.a)$$

$$I_2 = A \cdot (V_{BIAS} - V_{IN2} - V_{T12})^2 \quad (2.b)$$

where $A = K1 \cdot K2/(K1^{1/2} + K2^{1/2})^2$, and where $V_{T12} = V_{T1} + V_{T2}$, which represents transistor parameters of cascode stage 220 that are independent of voltage and current.

Equations (2.a) and (2.b) illustrate that when either input voltage signals $V_{IN1}$ or $V_{IN2}$ increases, the associated branch current $I_1$ or $I_2$ decreases. Therefore, branch 222 (including cascode transistors P4 and N2) and branch 224 (including cascode transistors P5 and N3) of cascode stage 220 transforms a difference between input voltage signals $V_{IN1}$, and $V_{IN2}$ to a difference between branch currents $I_1$ and $I_2$.

Input signals $V_{IN1}$, and $V_{IN2}$ can be expressed using a common voltage part Vo and differential voltage part ΔV in the following manner:

$$V_{IN1} = Vo - 0.5 \cdot \Delta V \quad (3.a)$$

$$V_{IN2} = Vo + 0.5 \cdot \Delta V \quad (3.b)$$

Using equations (3.a) and (3.b), equations 2.a and 2.b can be rewritten as follows:

$$I_1 = A \cdot (V_{BIAS-Vo} + 0.5 \cdot \Delta V - V_{T12})^2 \quad (4.a)$$

$$I_2 = A \cdot (V_{BIAS-Vo} - 0.5 \cdot \Delta V - V_{T12})^2 \quad (4.b)$$

From equations (4.a) and (4.b), a differential current $I_\Delta$ and a total current $I_\Sigma$ can be defined as follows:

$$I_\Delta = I_1 - I_2 = 2 \cdot \Delta V \cdot A \cdot (V_{BIAS} - Vo - V_{T12}) \quad (5)$$

$$I_\Sigma = I_1 + I_2 = 2 \cdot A \cdot (V_{BIAS} - Vo - V_{T12})^2 + 0.25 \cdot \Delta V^2) \quad (6)$$

Using equation (5), a transformation coefficient G, which is defined as differential current $I_\Delta$ divided by differential voltage ΔV, can be expressed as follows:

$$G = I_\Delta / \Delta V = 2 \cdot A \cdot (V_{BIAS} - Vo - V_{T12}) \quad (7)$$

In order to widen the dynamic range of comparator circuit 200 while producing a significant transformation coefficient G that is independent of average input voltage Vo, the difference between bias signal $V_{BIAS}$ and average input voltage Vo must be constant for all possible average input voltages Vo within the dynamic range. To satisfy this requirement, bias signal $V_{BIAS}$ must be adjusted with variations in average input voltage Vo such that this difference remains constant.

Adaptive bias voltage circuit 210 provides the required adjustment of bias signal $V_{BIAS}$. P-channel transistor P1 of adaptive bias voltage circuit 210 serves as a current source to create a constant current $I_{BIAS}$ that is independent of input voltage signals $V_{IN1}$ or $V_{IN2}$. Because bias current $I_{BIAS}$ is constant, both the voltage $V_{213}$ at node 213 (see FIG. 5) and bias signal $V_{BIAS}$ necessarily vary when average input voltage Vo varies (i.e., one or both of input voltage signals $V_{IN1}$ or $V_{IN2}$ are changed. This variation between bias signal $V_{BIAS}$ and node voltage $V_{213}$ occurs because if a transistor's current is constant, its gate-to-source voltage ($V_{gs}$) is also constant, and can be expressed by the following equations:

$$IN_5 = K3 \cdot (V_{213} - V_{IN1} - V_{T1})^2$$

$$= K3 \cdot (V_{213} - Vo + 0.5 \cdot \Delta V - V_{T1})^2 \quad (8.a)$$

$$IN_6 = K3 \cdot (V_{213} - V_{IN2} - V_{T1})^2$$

$$= K3 \cdot (V_{213} - Vo - 0.5 \cdot \Delta V - V_{T1})^2 \quad (8.b)$$

$$I_{BIAS} = K4 \cdot (V_{BIAS} - V_{213} - V_{T2}) \quad (8.c)$$

$$I_{BIAS} = I_{N5} + I_{N6} \quad (8.d)$$

where:
K3 and K4 are transconductance parameters of p-channel transistor P2 and P3 and n-channel transistor N1, respectively; and $V_{T1}$ and $V_{T2}$ are threshold voltage of p-channel transistors P2 and P3 and n-channel transistor N1, respectively (which are the same as those of p-channel transistors P4 and P5 and n-channel transistors N2 and N3 of cascode stage 220).

From equations (8.a) through (8.d), the following equation can be written:

$$I_{BIAS} = 2 \cdot K4 \cdot ((V_{213} - Vo - V_{T1})^2 + 0.25 \cdot \Delta V^2) \quad (9)$$

The following conclusion can be drawn from equations (8.c) and (9): if average input voltage Vo varies while $I_{BIAS}$, K3, K4, $V_{T1}$, $V_{T1}$, and ΔV remain constant, then node voltage $V_{213}$ and bias signal $V_{BIAS}$ vary simultaneously with average input voltage Vo. Therefore, the transformation coefficient G (see equation (7), above) is independent of average input voltage Vo, thereby allowing adaptive bias voltage circuit 210 to generate bias signal $V_{BIAS}$ such that a difference between bias signal $V_{BIAS}$ and average input voltage Vo remains constant.

All of the equations described above and the conclusions based on these equations require all transistors of adaptive bias voltage circuit 210 and cascode stage 220 to work in the strong inversion region. Therefore, the range of input voltage signals $V_{IN1}$ or $V_{IN2}$ in which transformation coefficient G is significant and independent of average input voltage Vo is limited. The low limit of the range is $V_{IN1} > -V_{T1}$ because, if $V_{IN1 < -VT1}$, then the gate voltages of p-channel transistors P2, P3, P4, and P5 are less than a difference between their respective drain and threshold voltages (i.e., $V_{gate} < V_{drain} - V_{T1}$), thereby causing these input transistors to operate outside of the strong inversion region. The upper limit is determined by average input voltage Vo; i.e., during the comparison mode (i.e., time interval T2 to T3; see FIGS. 3(A) and 3(B)), transistors N2 and N3 operate outside of the strong inversion region (i.e., $V_{gate} > V_{drain+VT2}$). Therefore the upper limit of the average input voltage $V_o$ (i.e., $V_o^{max}$) can be determined from the following equations:

$$V_{BIAS}^{max} = V_{222} + V_{T2} \quad (10a)$$

$$V_{BIAS}^{max} = V_{224} + V_{T2} \quad (10b)$$

where $V_{222} = V_{DD} - V_{gs}^{M4}$, and $V_{224} = V_{DD} - V_{gs}^{M5}$. From these equations and the equations set forth above:

$$V_o^{max} = V_{BIAS}^{max} - V_{gs}^{N2} - V_{gs}^{P4}$$

$$= V_{DD} - V_{T2} - V_{gs}^{M4} - V_{gs}^{N2} - V_{gs}^{P4}$$

$$\approx V_{DD} - 1.5V, \quad (11a)$$

or $$V_o^{max} = V_{BIAS}^{max} - V_{gs}gs^{N3} - V_{gs}gs^{P5}$$

$$= V_{DD} - V_{T2} - V_{gs}^{M5} - V_{gs}^{N3} - V_{gs}^{P5}$$

$$\approx V_{DD} - 1.5V. \quad (11)$$

For average input voltages greater than (e.g., greater than $V_{DD} - 1.5V$, branch currents $I_1$ and $I_2$ decrease because of a reduction in the gate-to-drain voltage ($V_{gs}$) of p-channel transistors P4 and P5 and n-channel transistors N2 and N3 decrease.

Figure 6:
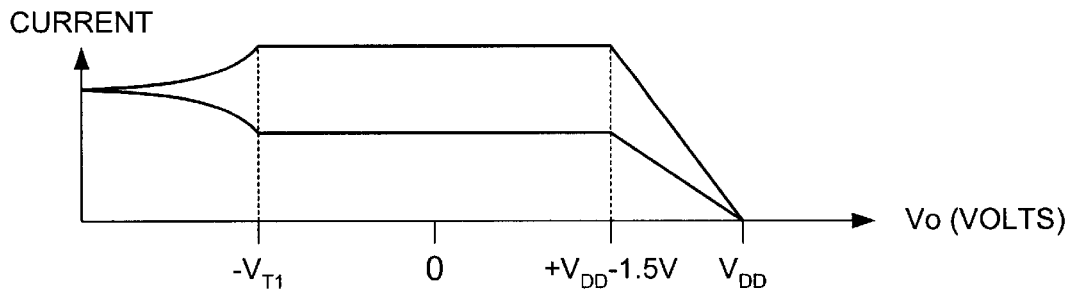
FIG. 6 is a diagram showing a relationship between an average input voltage and branch currents $I_1$ and $I_2$ that are generated in the comparator circuit shown in FIG. 5.
Figure 7:
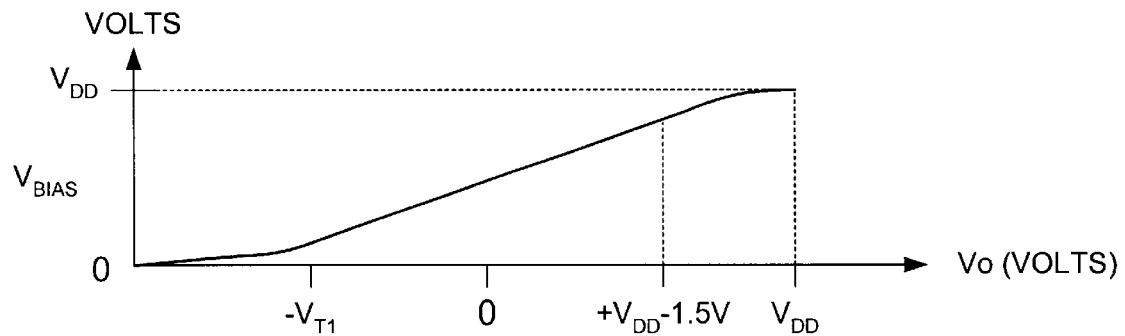
FIG. 7 is a diagram showing a relationship between the average input voltage and a bias voltage $V_{BIAS}$ that is generated in the comparator circuit shown in FIG. 5.
Figure 8:
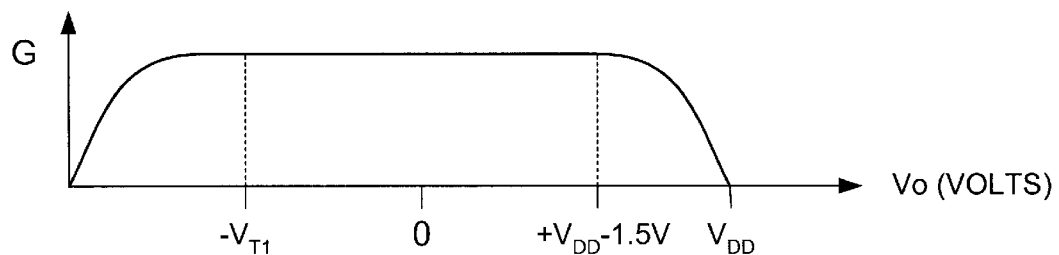
FIG. 8 is a diagram showing a relationship between the average input voltage and a transformation coefficient G indicating a relationship between current flow changes and input voltage changes in the comparator circuit shown in FIG. 5.

FIGS. 6, 7, and 8 are diagrams illustrating the relationships between average input voltage Vo and branch currents $I_1$ and $I_2$ (FIG. 6), bias signal $V_{BIAS}$ (FIG. 7), transformation coefficient G (FIG. 8). Specifically, FIG. 6 shows that the sum/difference between branch currents $I_1$ and $I_2$ remains essentially constant for average input voltages Vo between $-V_{T1}$ and $Vo^{max}$ ($V_{DD} - 1.5V$). Similarly, FIG. 8 shows that transformation coefficient G is essentially constant for average input voltages Vo between $-V_{T1}$ and $Vo^{max}$ ($V_{DD} - 1.5V$). Finally, FIG. 7 shows that bias signal $V_{BIAS}$ varies linearly for average input voltages Vo between $-V_{T1}$ and $V_{DD} - 1.5V$.

Although the invention has been described in connection with a specific embodiment, it is understood that this invention is not limited to the specific embodiment disclosed, but is capable of various modifications which would be apparent to a person skilled in the art. Thus, the invention is limited only by the following claims.

I claim:

1. A comparator circuit for comparing first and second input signals, the comparator circuit comprising:

an adaptive bias voltage circuit for generating a bias signal that is proportional to an average of the first and second input signals; and a cascode stage for generating first and second branch currents that are proportional to a difference between the first and second input signals, wherein the cascode stage is biased by the bias voltage such that the first and second branch currents are independent of said average of the first and second input signals.

2. The comparator according to claim 1, wherein the adaptive bias voltage circuit comprises:

an n-channel transistor having a first terminal and a gate terminal connected to the bias signal;

a first p-channel transistor connected between a second terminal of the first n-channel transistor and a low voltage source, the first p-channel transistor having a gate terminal connected to receive the first input signal; and a second p-channel transistor connected between the second terminal of the first n-channel transistor and the low voltage source, the second p-channel transistor having a gate terminal connected to receive the second input signal.

3. The comparator according to claim 2, wherein the adaptive bias voltage circuit further comprises a third p-channel transistor having a first terminal connected to a system voltage source, a second terminal connected to the first terminal and gate terminal of the first n-channel transistor, and a gate terminal connected to an externally-generated control voltage.

4. The comparator according to claim 2, wherein the cascode stage comprises:

a second n-channel transistor having a gate terminal connected to the bias signal;

a fourth p-channel transistor connected between the second n-channel transistor and the low voltage source, the fourth p-channel transistor having a gate terminal connected to receive the first input signal;

a third n-channel transistor having a gate terminal connected to the bias signal; and a fifth p-channel transistor connected between the third n-channel transistor and the low voltage source, the fifth p-channel transistor having a gate terminal connected to receive the second input signal, wherein the first branch current is transmitted through the second n-channel transistor and the fourth p-channel transistor, and wherein the second branch current is transmitted through the third n-channel transistor and the fifth p-channel transistor.

5. The comparator according to claim 4, further comprising a p-channel flip-flop including a sixth p-channel transistor connected between a system voltage source and a first node, and a seventh p-channel transistor connected between the system voltage source and a second node, wherein a gate terminal of the sixth p-channel transistor is connected to the second node and a gate terminal of the seventh p-channel transistor is connected to the first node, wherein the second n-channel transistor of the cascode state is connected between the first node and the fourth p-channel transistor, and wherein the third n-channel transistor of the cascode state is connected between the second node and the fourth p-channel transistor.

6. The comparator according to claim 5, further comprising an n-channel flip-flop including a fourth n-channel transistor connected between the sixth p-channel transistor and the low voltage source, and a fifth n-channel transistor connected between the seventh p-channel transistor and the low voltage source.

7. The comparator according to claim 6, further comprising an eighth p-channel transistor connected between the first node and the second node, wherein a gate terminal of the eighth p-channel transistor is connected to a first clock signal.

8. The comparator according to claim 7, further comprising:
- a ninth p-channel transistor connected between the sixth p-channel transistor and the fourth n-channel transistor, where a third node is formed between the tenth p-channel transistor and the fourth n-channel transistor;
- a sixth n-channel transistor connected between the third node and the low voltage source;
- a tenth p-channel transistor connected between the seventh p-channel transistor and the fifth n-channel transistor, where a fourth node is formed between the tenth p-channel transistor and the fifth n-channel transistor; and
- a seventh n-channel transistor connected between the fourth node and the low voltage source,
- wherein gate terminals of the ninth p-channel transistor, the sixth n-channel transistor, the tenth p-channel transistor, and the seventh n-channel transistor are connected to a second clock signal.

9. The comparator according to claim 1, further comprising a switch circuit for generating an output signal in response to the first and second branch currents, wherein the output signal has a first level when the first input signal is greater than the second input signal, and wherein the output signal has a second level when the first input signal is less than the second input signal.

10. The comparator according to claim 9, wherein the adaptive bias voltage circuit comprises:
- a n-channel transistor having a first terminal and a gate terminal connected to the bias signal;
- a first p-channel transistor connected between a second terminal of the first n-channel transistor and a low voltage source, the first p-channel transistor having a gate terminal connected to receive the first input signal; and
- a second p-channel transistor connected between the second terminal of the first n-channel transistor and the low voltage source, the second p-channel transistor having a gate terminal connected to receive the second input signal.

11. The comparator according to claim 10, wherein the adaptive bias voltage circuit further comprises a third p-channel transistor having a first terminal connected to a system voltage source, a second terminal connected to the first terminal and gate terminal of the first n-channel transistor, and a gate terminal connected to an externally-generated control voltage.

12. The comparator according to claim 10, wherein the cascode stage comprises:
- a second n-channel transistor having a gate terminal connected to the bias signal;
- a fourth p-channel transistor connected between the second n-channel transistor and the low voltage source, the fourth p-channel transistor having a gate terminal connected to receive the first input signal;
- a third n-channel transistor having a connected to the bias signal; and
- a fifth p-channel transistor connected between the third n-channel transistor and the low voltage source, the fifth p-channel transistor having a gate terminal connected to receive the second input signal,
- wherein the first branch current is transmitted from the switch circuit through the second n-channel transistor and the fourth p-channel transistor, and wherein the second branch current is transmitted from the switch circuit through the third n-channel transistor and the fifth p-channel transistor.

13. A comparator circuit for comparing first and second input signals, the comparator circuit comprising:
- a cascode stage for generating first and second branch currents that are proportional to a difference between the first and second input signals, wherein the cascode stage is biased by a bias voltage such that the first and second branch currents are independent of an average of the first and second input signals; and
- a switch circuit for generating an output signal in response to the first and second branch currents, wherein the output signal has a first level when the first input signal is greater than the second input signal, and wherein the output signal has a second level when the first input signal is less than the second input signal.

14. The comparator according to claim 13, wherein the cascode stage comprises:
- a first n-channel transistor having a gate terminal connected to the bias signal;
- a first n-channel transistor connected between the second n-channel transistor and the low voltage source, the fourth p-channel transistor having a gate terminal connected to receive the first input signal;
- a second n-channel transistor having a gate terminal connected to the bias signal; and
- a second p-channel transistor connected between the second n-channel transistor and the low voltage source, the second p-channel transistor having a gate terminal connected to receive the second input signal,
- wherein the first branch current is transmitted from the switch circuit through the first n-channel transistor and the first p-channel transistor, and
- wherein the second branch current is transmitted from the switch circuit through the second n-channel transistor and the second p-channel transistor.

15. The comparator according to claim 14, wherein the switch circuit comprises a p-channel flip-flop including a third p-channel transistor connected between a system voltage source and a first node, and a fourth p-channel transistor connected between the system voltage source and a second node,
- wherein a gate terminal of the third p-channel transistor is connected to the second node and a gate terminal of the fourth p-channel transistor is connected to the first node,
- wherein the first n-channel transistor of the cascode stage is connected between the first node and the first p-channel transistor, and
- wherein the second n-channel transistor of the cascode stage is connected between the second node and the first p-channel transistor.

16. The comparator according to claim 15, wherein the switch circuit further comprises an n-channel flip-flop including a third n-channel transistor connected between the third p-channel transistor and the low voltage source, and a fourth n-channel transistor connected between the fourth p-channel transistor and the low voltage source.

17. The comparator according to claim 14, further comprising an adaptive bias voltage circuit for generating the bias signal such that the bias signal is proportional to an average of the first and second input signals.

18. The comparator according to claim 17, wherein the adaptive bias voltage circuit comprises:
- a n-channel transistor having a first terminal and a gate terminal connected to the bias signal;
- a first p-channel transistor connected between a second terminal of the first n-channel transistor and a low voltage source, the first p-channel transistor having a gate terminal connected to receive the first input signal; and
- a second p-channel transistor connected between the second terminal of the first n-channel transistor and the low voltage source, the second p-channel transistor having a gate terminal connected to receive the second input signal.

19. The comparator according to claim 18, wherein the adaptive bias voltage circuit further comprises a third p-channel transistor having a first terminal connected to a system voltage source, a second terminal connected to the first terminal and gate terminal of the first n-channel transistor, and a gate terminal connected to an externally-generated control voltage.

20. A comparator circuit for comparing first and second input signals, the comparator circuit comprising:
- means for generating a bias signal that is proportional to an average of the first and second input signals; and
- means for generating first and second branch currents that are proportional to a difference between the first and second input signals, wherein the cascode stage is biased by the bias voltage such that the first and second branch currents are independent of said average of the first and second input signals; and
- a switch circuit for generating an output signal in response to the first and second branch currents, wherein the output signal has a first level when the first input signal is greater than the second input signal, and wherein the output signal has a second level when the first input signal is less than the second input signal.

\* \* \* \* \*